US006661235B2

(12) United States Patent
Rokunohe et al.

(10) Patent No.: US 6,661,235 B2
(45) Date of Patent: Dec. 9, 2003

(54) METHOD AND DEVICE FOR DETECTING A PARTIAL DISCHARGE IN AN ELECTRICAL DEVICE

(75) Inventors: Toshiaki Rokunohe, Hitachinaka (JP); Hirohiko Yatsuzuka, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 27 days.

(21) Appl. No.: 09/875,939

(22) Filed: Jun. 8, 2001

(65) Prior Publication Data

US 2002/0024341 A1 Feb. 28, 2002

(30) Foreign Application Priority Data

Aug. 28, 2000 (JP) ........................................ 2000-263251

(51) Int. Cl.[7] ........................ H01H 31/02; H01H 31/12; H04B 3/46
(52) U.S. Cl. ........................ 324/536; 324/541; 324/551; 324/552
(58) Field of Search ................. 324/536, 750, 324/555, 541, 551, 552

(56) References Cited

U.S. PATENT DOCUMENTS

| | | | | |
|---|---|---|---|---|
| 3,801,899 A | * | 4/1974 | Liao ........................... | 324/536 |
| 4,159,401 A | * | 6/1979 | Kamata .................... | 174/31 R |
| 4,254,422 A | * | 3/1981 | Kloepfer et al. ............ | 343/792 |
| 4,547,769 A | * | 10/1985 | Tanigaki et al. ............. | 340/605 |
| 5,214,595 A | * | 5/1993 | Ozawa et al. ................ | 324/536 |
| 5,256,976 A | * | 10/1993 | Ishikawa et al. .......... | 174/11 R |
| 5,569,891 A | * | 10/1996 | Freeman et al. .......... | 200/17 R |
| 5,726,576 A | | 3/1998 | Miyata et al. | |
| 6,014,083 A | * | 1/2000 | Bauerschmidt et al. ..... | 324/126 |
| 6,333,715 B1 | * | 12/2001 | Kato et al. ................... | 126/193 |

FOREIGN PATENT DOCUMENTS

| JP | 3-78429 | 4/1991 |
|---|---|---|
| JP | 9-68556 | 3/1997 |

OTHER PUBLICATIONS

A.G. Sellars, et al; "Using the UHF Technique to Investigate PD Produced by Defects in Solid Insulation"; IEEE Transactions on Dielectrics and Electrical Insulation, vol. 2 No. 3, Jun. 1995; pp448–459.

* cited by examiner

Primary Examiner—Jay Patidar
Assistant Examiner—John Teresinski
(74) Attorney, Agent, or Firm—Dickstein Shapiro Morin & Oshinsky LLP

(57) ABSTRACT

The present invention provides a method and device for detecting a discharge in an electrical device comprising, providing a bushing having a bottom lower flange and a top upper flange, providing a shield inside the bushing extending from the bottom lower flange to a position at least below the top upper flange and providing an antenna outside the bushing at least above the position for measuring an output signal from the device for detecting the discharge.

26 Claims, 7 Drawing Sheets

(1) DIPOLE ANTENNA (2) FOLDED DIPOLE ANTENNA (3) SLIT ANTENNA (4) LOOP ANTENNA

METHOD AND DEVICE FOR DETECTING A PARTIAL DISCHARGE IN AN ELECTRICAL DEVICE

FIELD OF THE INVENTION

The present invention relates to a method and device for detecting partial discharge, in particular, a method and device for detecting partial discharge in a gas insulated device.

DISCUSSION OF THE RELATED ART

Conventional insulating devices include gas insulating switches, gas insulating buses, gas insulating transformers and oil transformers, which are all used in an electric power substation. These insulating devices insulate a high-voltage center conductor using an insulator, such as $SF_6$, inside a sealed metal container or bushing. A defect such as a loose connection in the bushing or the existence of a foreign material in the bushing, can cause a dielectric breakdown of the electrical power device (substation).

A dielectric breakdown accident, which is one of the most serious accidents of an electrical power device, is often accompanied by a partial discharge as a forerunning phenomenon. Therefore, by detecting a partial discharge, an abnormality in the insulation of an electrical power device can be detected at an early stage or in an insignificant state in which a dielectric breakdown accident would not be caused. Thus, in an electrical power device, the preventive maintenance technique is important.

A conventional method for detecting a partial discharge provides an antenna (sensor) on a bushing lower tank of a bushing so that electromagnetic waves caused by partial discharge inside an insulating device can be detected. In other words, the antenna is typically provided in a base portion of the bushing. A cable typically connects to the antenna and is further connected to a conventional measuring device for measuring the discharge. Unfortunately, the conventional methods and devices for detecting a partial discharge provides low sensitivity to electromagnetic waves inside an insulating device due to interference from various component parts residing in the insulating device. Thus, a partial discharge cannot be timely or accurately detected in conventional methods and devices.

SUMMARY OF THE INVENTION

The present invention provides a method and device for detecting a partial discharge inside an insulating device with high sensitivity and accuracy.

In an object of the present invention a method for detecting a discharge in an electrical device is provided. The method comprises the acts of providing a bushing having a bottom lower flange and a top upper flange. Further the method provides a shield inside the bushing extending from the bottom lower flange to a position at least below the top upper flange and providing an antenna outside the bushing at least above the referenced position for measuring an output signal from the device for detecting the discharge.

In another object of the present invention a method for detecting a discharge in an electrical device is provided. The method comprises providing a bushing having a bottom lower flange and a top upper flange and providing an antenna outside the bushing at a position for measuring an output signal from the device for detecting the discharge. The method further provides the position be located above the bottom lower flange at about 3–20% of the distance between the bottom lower flange and top upper flange.

In yet another object of the present invention a discharge detector for an electrical device is provided comprising a bushing having a bottom lower flange and a top upper flange and a shield inside the bushing extending from the bottom lower flange to a position at least below the top upper flange. The detector further includes an antenna located outside the bushing at least above the referenced position for measuring an output signal from the device for detecting the discharge.

In yet another object of the present invention a discharge detector for an electrical device is provided comprising a bushing having a bottom lower flange and a top upper flange and an antenna outside the bushing at a position for measuring an output signal from the device for detecting the discharge. The position is located above the bottom lower flange at about 3–20% of the distance between the bottom lower flange and top upper flange.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

Figure 1A:
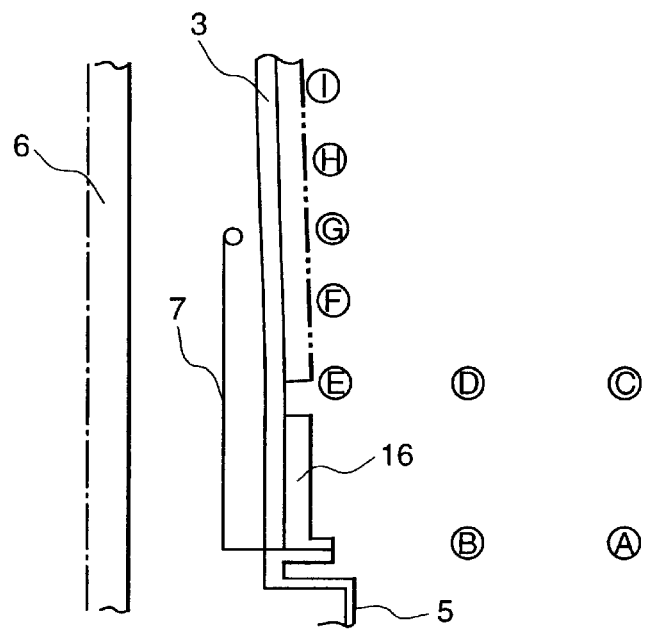
FIG. 1(A) illustrates various positions of an antenna for demonstrating the sensitivity of the antenna on detecting a partial discharge.
Figure 1B:
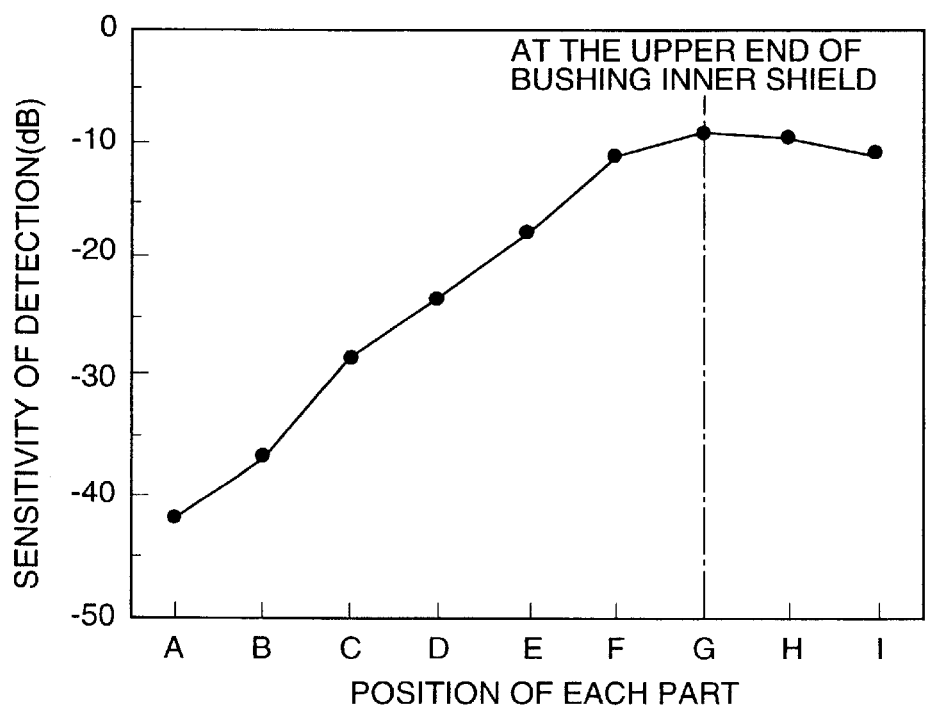
FIG. 1(B) illustrates in graphical form the influence of the position of an antenna on the sensitivity of detecting a partial discharge.

Exemplary embodiment of the present invention will be described below in connection with the drawings. Other embodiments may be utilized and structural or logical changes may be made without departing from the spirit or scope of the present invention. Like items are referred to by like reference numerals throughout the drawings.

Figure 2:
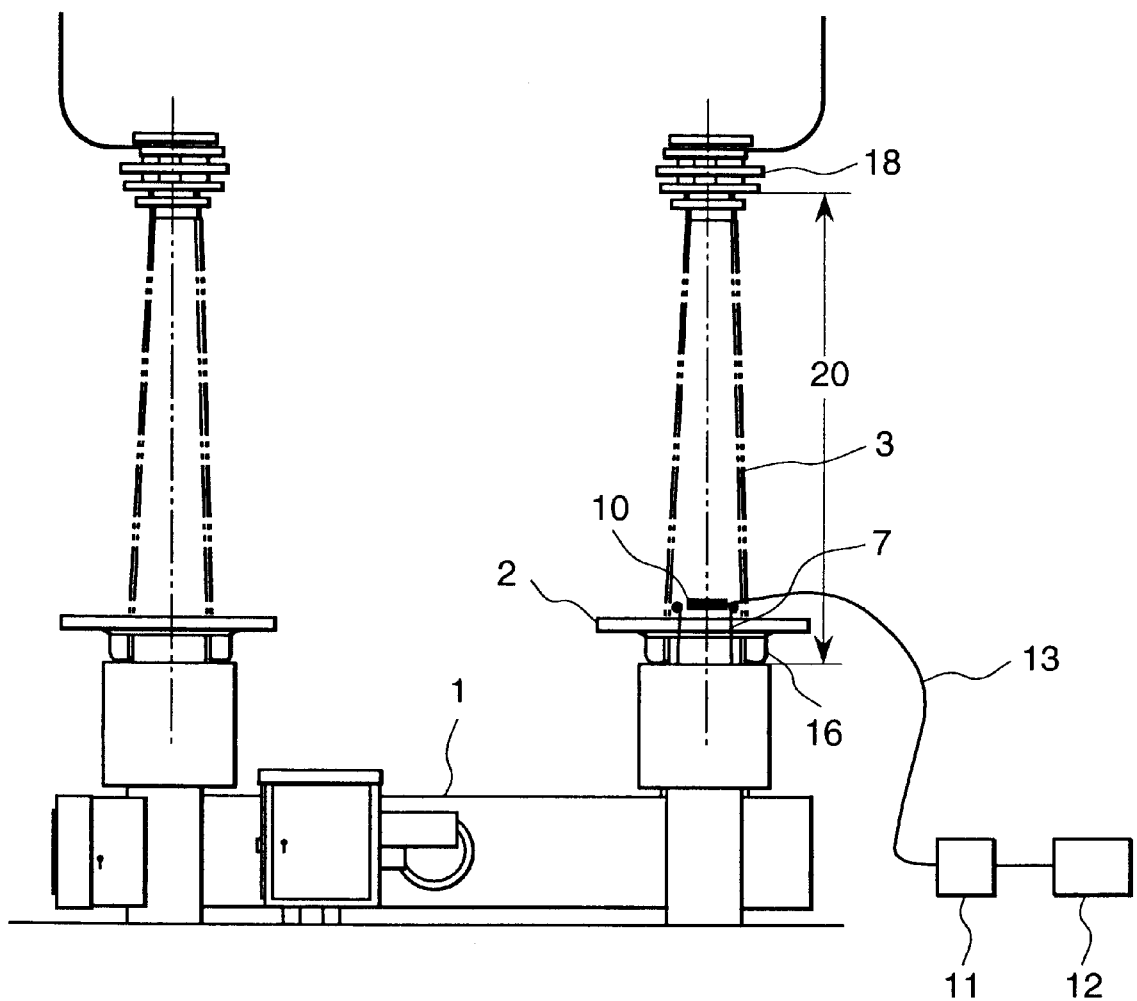
FIG. 2 illustrates an embodiment of the present invention.

Referring now to the drawings, FIG. 1(A) illustrates various positions as denoted by "A"–"I," where different positional measurements for electromagnetic waves were made. Also, FIG. 1(A) is an exploded sectional view illustrating a bottom portion of a bushing 3. An inner shield 7 is provided between a center conductor 6 and a bushing 3. Inner shield 7 is utilized to increase the breakdown voltage of the electrical power device. Inner shield 7 extends from the bottom of the lower flange 16 towards an upper flange 18 (FIG. 2). As can be seen from the drawings, the position of the antenna 10 (FIG. 2) greatly influences the sensitivity of detecting electromagnetic waves. As shown, the closer the antenna 10 is to the outside surface of the bushing 3, the higher the sensitivity of detecting electromagnetic waves becomes. For example, at position "A," the sensitivity is only about −43 dB while at position "B," the sensitivity is increased to about −38 dB. In addition, when the position of the antenna 10 is moved from the bottom of the lower flange 16 to the upper flange 18, the sensitivity of the detection becomes higher. For example, at position "A," the sensitivity is only about −43 dB while at position "C," the sensitivity is increased to about −28 dB. But, when the position of the antenna 10 is moved to positions higher than the terminal end of the inner shield 7, the sensitivity of the detection becomes lower. For example, at position "G," the sensitivity shows a peak value of about −10 dB but steadily decreases when antenna 10 is positioned at "H" and "I." Accordingly, it is possible to achieve very high sensitivity of the detection by placing the antenna 10 of a partial discharge detecting device at the outside surface of the bushing 3 corresponding to the upper terminus of the inner shield 7. In other words, bushing 3 has a lower flange 16 and an upper flange 18 with a shield 7 inside the bushing which extends from the bottom of the lower flange 16 to a position at least below the top of the upper flange 18. The antenna 10 is provided outside the bushing 3 at least above the upper terminus of the inner shield 7 for measuring an output signal from the electrical power device for detecting a discharge.

FIG. 2 shows an embodiment of the present invention, in which the antenna 10 is placed in the vicinity of a outside shield 2 of a gas-blast circuit breaker (GCB) 1. An output signal detected by the antenna 10 is sent through a cable 13 that provides a small attenuation of the signal. An amplifier 11 improves S/N ratio of the signal. Then, the output signal is measured by a measuring instrument 12. By providing the antenna 10 at a position just above the inner shield 7 and outside the bushing 3 when inspecting the GCB 1, an accurate and efficient method for detecting a partial-discharge is provided. Note, inner shield 7 extends to a position, which is some portion of the entire length 20, from the bottom of the lower flange 16 towards the top portion of the upper flange 18. The antenna 10 is provided at least above this position or, in other words, the terminal portion of the inner shield 7.

Figure 3:
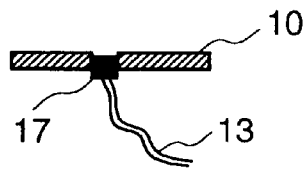
FIGS. 3(1)–3(4) illustrate exemplary antennas utilized in the present invention.
Figure 3:
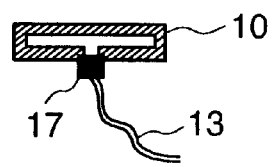
Figure 3:
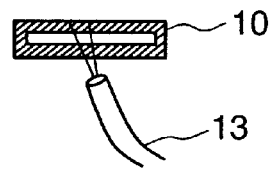
Figure 3:
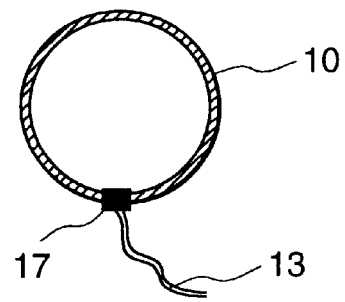

Referring now to FIGS. 3(1)–3(4), exemplary antennas utilized in the present invention are shown. For example, for antenna 10, an antenna such as a dipole antenna 3(1), a folded dipole antenna 3(2), a slit antenna 3(3) and a loop antenna 3(4), can be used. The antenna 10 is connected to cable 13 at connection 17. Also, covering the antenna 10 with a metallic material can shield the antenna 10 from further outside noise and achieve greater improvement in S/N ratio.

Figure 4:
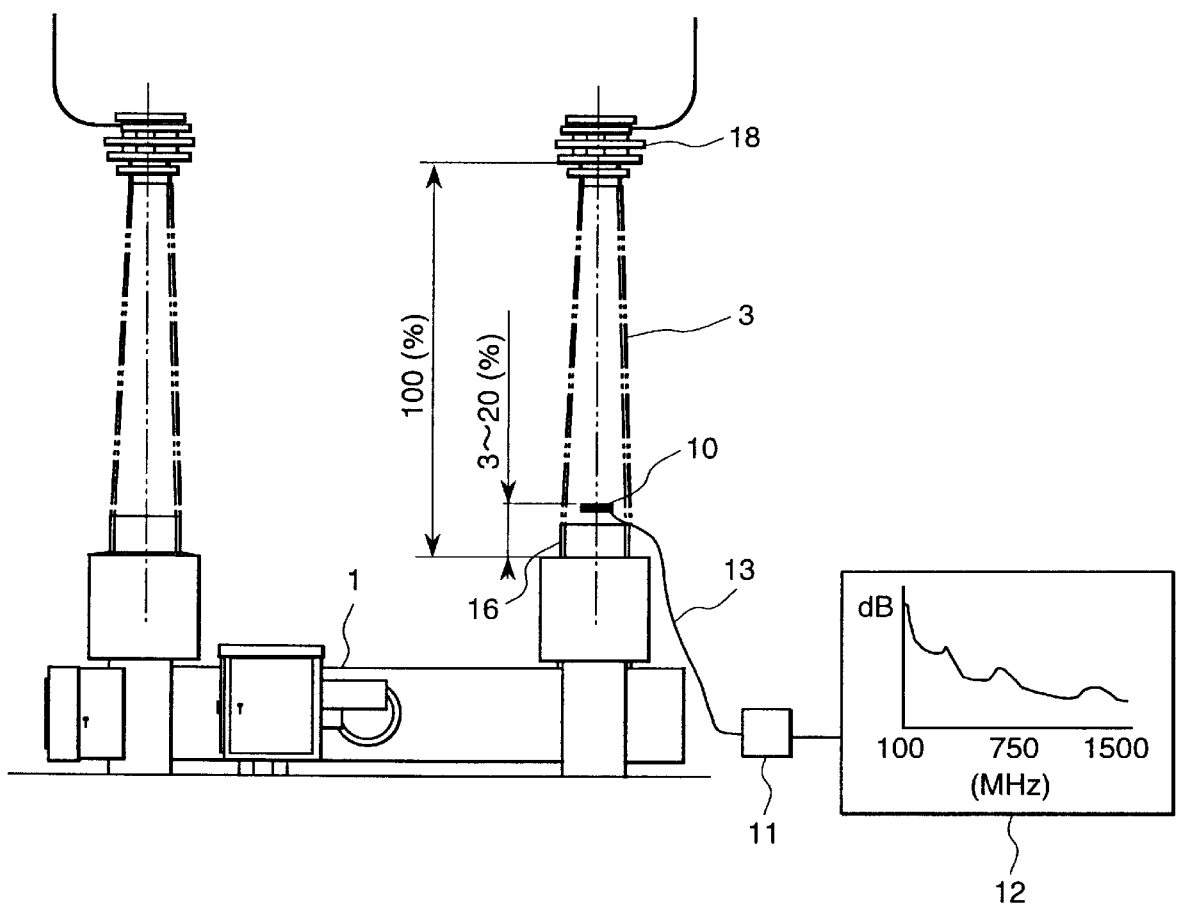
FIG. 4 illustrates another embodiment of the present invention.

FIG. 4 is an embodiment in which the bushing 3 has no outside lower shield 2. As shown, antenna 10 is provided at a position located above the lower flange 16 at about 3–20% of the distance between the bottom of the lower flange 16 to the top of the upper flange 18. Hence, in this embodiment, irrespective of the existence or position of the inner shield 7, the antenna 10 is provided at an optimal position, namely, at a distance of about 3–20% of the entire distance 20 between the bottom of the lower flange 16 to the top of the upper flange 18, where sensitivity to electromagnetic waves is greatest. Also, a frequency band from 100 MHz to 1500 MHz is selected from an output signal (electromagnetic waves) of an electrical power device. Measuring instrument 12 is used to determine whether or not partial discharge inside the GCB 1 exists. The diagram shown in the measuring instrument 12, for example, a spectrum analyzer, illustrates a detected output signal for which the frequency band of 100 MHz to 1500 MHz is utilized.

Figure 5:
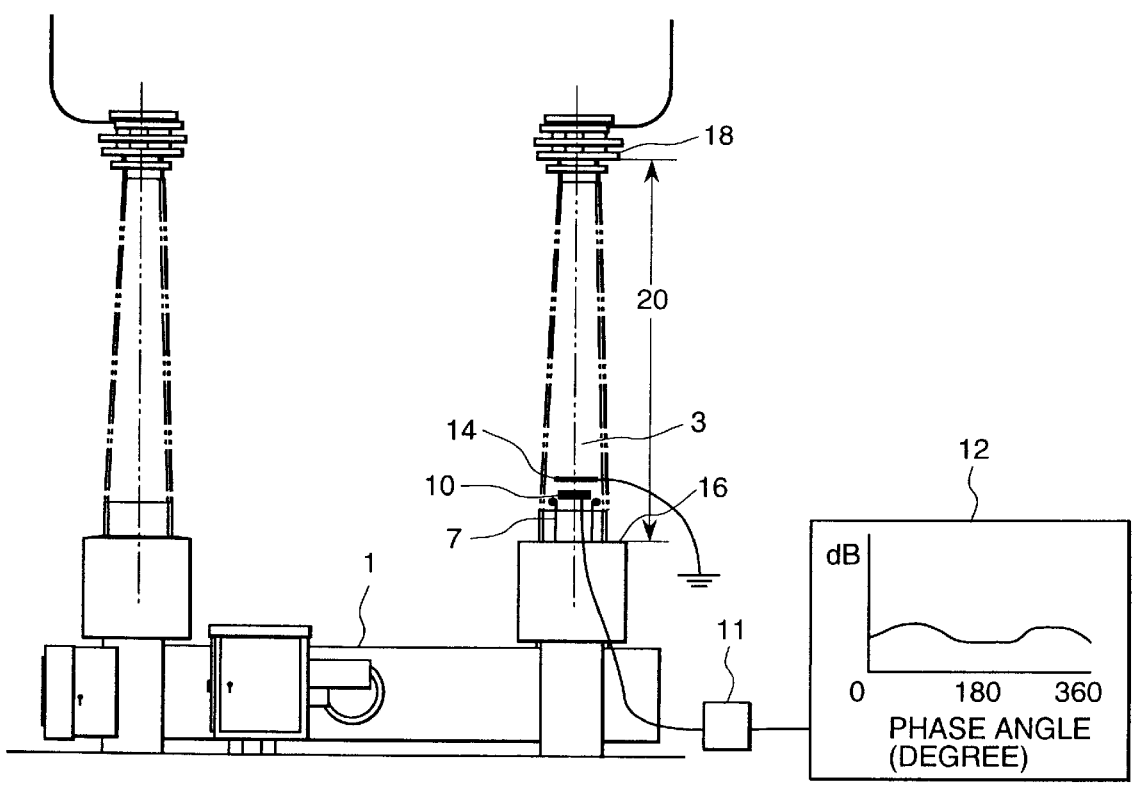
FIG. 5 illustrates yet another embodiment of the present invention.

FIG. 5 shows an embodiment, in which a ground electrode 14 is placed adjacent to the antenna 10. The ground electrode 14 prevents potential induced by the antenna 10 while electricity is being provided. Hence, there is no need to keep amplifier 11 and the measuring instrument 12 away from a ground. This method provides easier and safer detection of partial discharge. In addition, a periodic factor, for example, a power phase is given to a specific frequency measured by the measuring instrument 12. In this way, the periodicity of the output signal is utilized to detect the occurrence of partial discharge inside the GCB 1. An example of the measurement utilizing the periodicity is shown in the measuring instrument 12.

Figure 6:
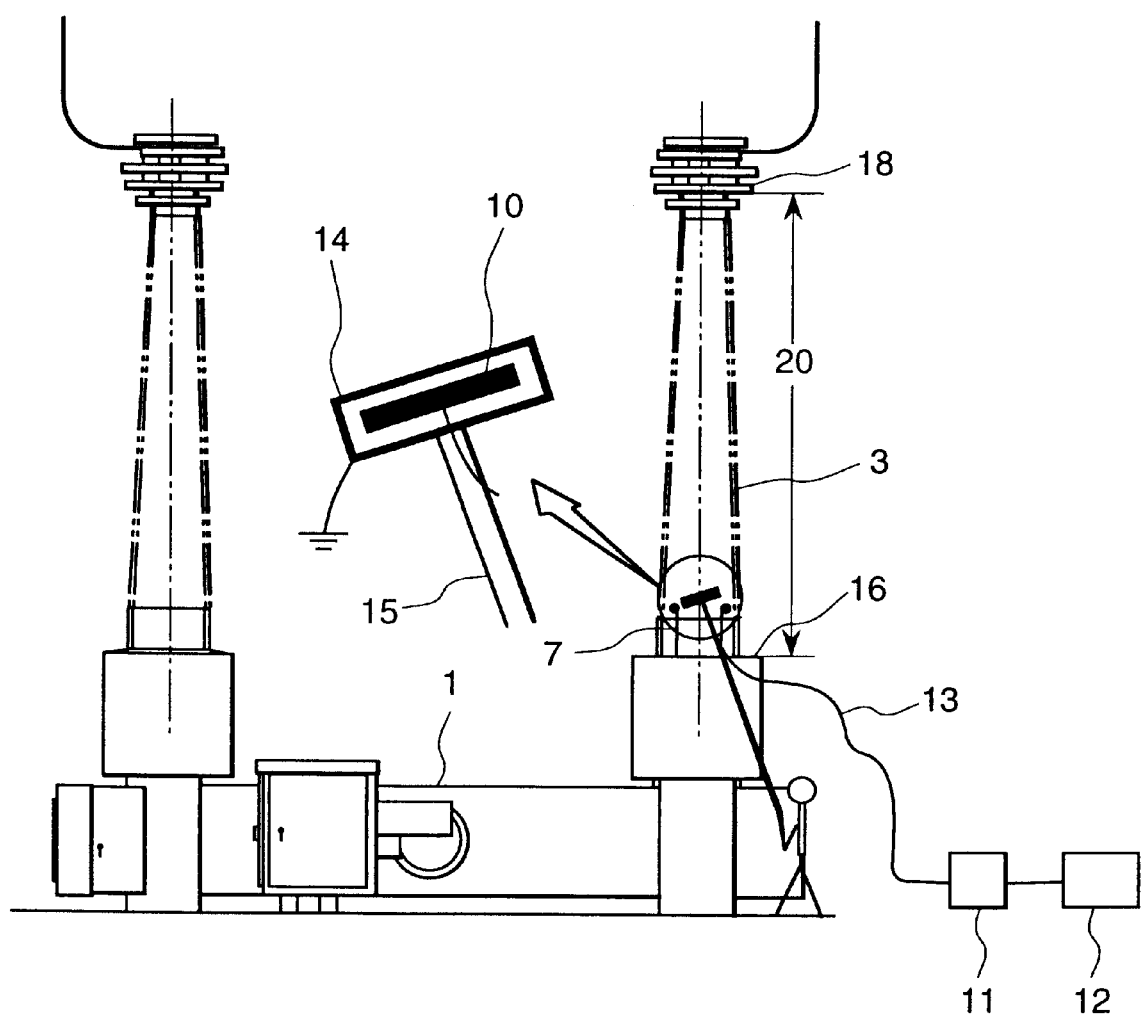
FIG. 6 illustrates another embodiment of the present invention.
Figure 7:
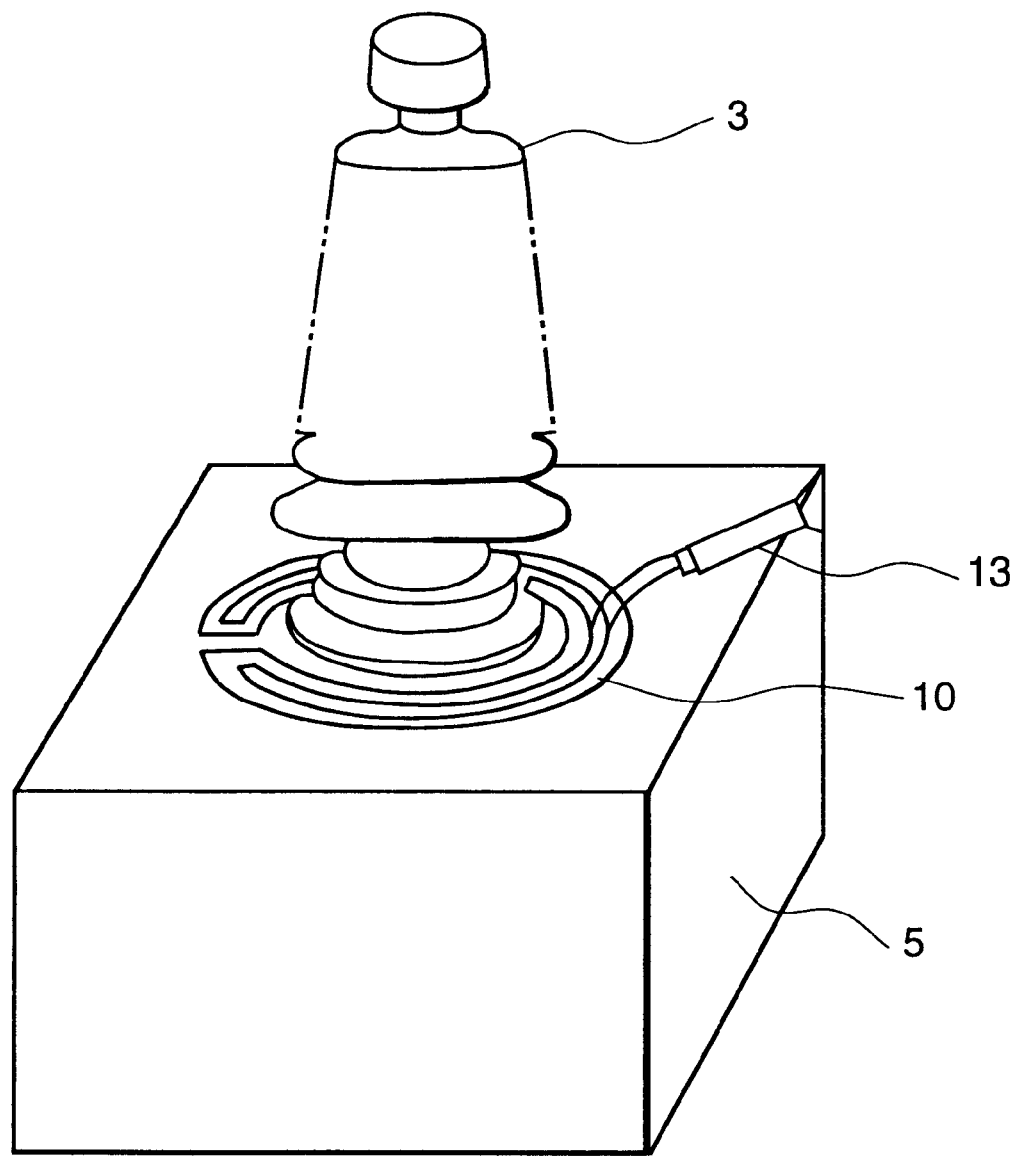
FIG. 7 illustrates a prior art method and device for detecting a partial discharge.

FIG. 6 is an embodiment of a partial discharge measuring device comprising an antenna 10 at the upper end of an insulating bar 15. Surrounding the antenna 10 with a ground electrode 14 can further prevent potential induced by the antenna 10. This eliminates the need for insulating the amplifier 11 and the measuring instrument 12 and for keeping them away from a ground and enables measurement of partial discharge inside the GCB 1 easily without stopping power supply. In addition, even if an abnormal condition is detected, it is possible to provide the measuring instrument 12 with a function of judging whether or not an emergency measure is required. But, if normal condition exists inside the GCB 1, it is possible to proceed with the next measurement of another GCB 1 immediately. As a result, testing time becomes much shorter than the time that has been conventionally spent.

Hence, the present invention provides a method and device for detecting a discharge in an electrical power device. The invention comprises providing a bushing having a bottom lower flange and a top upper flange. Further the invention provides a shield inside the bushing extending from the bottom lower flange to a position at least below the top upper flange and providing an antenna outside the bushing at least above the referenced position for measuring an output signal from the device for detecting the discharge.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A method for detecting a discharge in an electrical device, comprising the acts of:
   providing a bushing having an outside surface, a bottom lower flange and a top upper flange;
   providing a shield inside said bushing extending from said bottom lower flange to a position at least below said top upper flange; and
   providing an antenna at said outside surface of said bushing at least above said position for measuring an output signal from said device for detecting said discharge.

2. The method of claim 1 further comprising the act of utilizing a frequency of about 100 Mhz to about 1500 Mhz in said output signal for said detection.

3. The method of claim 1 further comprising the act of utilizing a change in periodicity of said output signal for said detection.

4. The method of claim 1 wherein said position is located above said lower flange at a position in a range of 3–20% of the distance between said bottom lower flange and said top upper flange.

5. The method of claim 1 wherein said antenna comprises one from the group composed of a dipole antenna, a folded dipole antenna, a slit antenna, and a loop antenna.

6. The method of claim 1 further comprising the act of providing a ground electrode adjacent said antenna for preventing induced potential.

7. The method of claim 1 further comprising the act of providing a ground electrode surrounding said antenna for preventing induced potential.

8. The method of claim 1 wherein said electrical device is a gas insulating device.

9. A method for detecting a discharge in an electrical device, comprising the acts of:
   providing a bushing having a bottom lower flange and a top upper flange;
   providing an outside shield for a gas circuit breaker adjacent said bushing;
   providing an antenna on a surface of said bushing in the vicinity of said outside shield at a position for measuring an output signal from said device for detecting said discharge; and
   said position being located above said bottom lower flange in a range of 3–20% of the distance between said bottom lower flange and said top upper flange.

10. The method of claim 9 further comprising the act of utilizing a frequency of about 100 Mhz to about 1500 Mhz in said output signal for said detection.

11. The method of claim 9 further comprising the act of utilizing a change in periodicity of said output signal for said detection.

12. The method of claim 9 wherein said antenna comprises one from the group composed of a dipole antenna, a folded dipole antenna, a slit antenna and a loop antenna.

13. The method of claim 9 further comprising the act of providing a ground electrode adjacent said antenna for preventing induced potential.

14. The method of claim 9 further comprising the act of providing a ground electrode surrounding said antenna for preventing induced potential.

15. The method of claim 9 wherein said electrical device is a gas insulating device.

16. A discharge detector for an electrical device, comprising:
   a bushing having an outside surface, a bottom lower flange and a top upper flange;
   a shield inside said bushing extending from said bottom lower flange to a position at least below said top upper flange; and
   an antenna located on said outside surface of said bushing at least above said position for measuring an output signal from said device for detecting said discharge.

17. The detector of claim 16 wherein said position is is located above said bottom lower flange at a position in a range of 3–20% of the distance between said bottom lower flange and said top upper flange.

18. The method of claim 16 wherein said antenna comprises one from the group composed of a dipole antenna, a folded dipole antenna, a slit antenna and a loop antenna.

19. The detector of claim 16 further comprising a ground electrode adjacent said antenna for preventing induced potential.

20. The detector of claim 16 further comprising a ground electrode surrounding said antenna for preventing induced potential.

21. The detector of claim 16 wherein said electrical device is a gas insulating device.

22. A discharge detector for an electrical device, comprising:
   a bushing having a bottom lower flange and a top upper flange;
   an outside shield for a gas circuit breaker adjacent said bushing;
   an antenna on a surface of said bushing in the vicinity of said outside shield at a position for measuring an output signal from said device for detecting said discharge; and
   said position being located above said bottom lower flange in a range of 3–20% of the distance between said bottom lower flange and said top upper flange.

23. The detector of claim 22 wherein said antenna comprises one from the group composed of a dipole antenna, a folded dipole antenna, a slit antenna and a loop antenna.

24. The detector of claim 22 further comprising a ground electrode adjacent said antenna for preventing induced potential.

25. The detector of claim 22 further comprising a ground electrode surrounding said antenna for preventing induced potential.

26. The detector of claim 22 wherein said electrical device is a gas insulating device.

* * * * *